United States Patent
Benjamin et al.

(10) Patent No.: US 11,353,942 B2
(45) Date of Patent: *Jun. 7, 2022

(54) POWER DELIVERY TIMING FOR MEMORY

(71) Applicant: Micron Technology, Inc., Boise, ID (US)

(72) Inventors: Keith A. Benjamin, Blaine, MN (US); Thomas Dougherty, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/126,651

(22) Filed: Dec. 18, 2020

(65) Prior Publication Data
US 2021/0200292 A1 Jul. 1, 2021

Related U.S. Application Data

(63) Continuation of application No. 16/729,808, filed on Dec. 30, 2019, now Pat. No. 10,877,541.

(51) Int. Cl.
*G11C 8/18* (2006.01)
*G06F 1/3203* (2019.01)
*G05B 15/02* (2006.01)
*G11C 16/10* (2006.01)

(52) U.S. Cl.
CPC .......... *G06F 1/3203* (2013.01); *G05B 15/02* (2013.01); *G11C 16/10* (2013.01)

(58) Field of Classification Search
CPC ........ G06F 1/3203; G05B 15/02; G11C 16/10
USPC .................................................... 365/233.5
See application file for complete search history.

(56) References Cited

U.S. PATENT DOCUMENTS

| | | | |
|---|---|---|---|
| 7,039,821 B1 | 5/2006 | Potega | |
| 7,058,484 B1 | 6/2006 | Potega | |
| 8,724,422 B1 | 5/2014 | Agness | |
| 9,606,742 B1 | 3/2017 | Cho et al. | |
| 10,209,727 B2 | 2/2019 | Chapel et al. | |
| 10,877,541 B1 * | 12/2020 | Benjamin | G05B 15/02 |

(Continued)

FOREIGN PATENT DOCUMENTS

KR 10-2015-0047854 A 5/2015

OTHER PUBLICATIONS

International Search Report and Written Opinion from related international application No. PCT/US2020/065601, dated Apr. 5, 2021, 9 pages.

*Primary Examiner* — Huan Hoang
(74) *Attorney, Agent, or Firm* — Brooks, Cameron & Huebsch, PLLC

(57) ABSTRACT

A system can comprise a memory device and sequencing circuitry configured to provide enable signals to a number of voltage regulators in association with providing sequenced power signals to the memory device. The system can include voltage threshold detection circuitry configured to: detect primary supply voltage events; and responsive to detecting a primary supply voltage event, deassert a timer enable signal provided to timing circuitry. The timing circuitry is configured to, responsive to the deassertion of the timer enable signal: deassert a primary enable signal provided to the sequencing circuitry; and maintain the primary enable signal in a deasserted state for a particular amount of time prior to reasserting the primary enable signal.

20 Claims, 5 Drawing Sheets

(56) References Cited

U.S. PATENT DOCUMENTS

| | | |
|---|---|---|
| 10,921,996 B2* | 2/2021 | Bell .................. G11C 7/24 |
| 2006/0062070 A1 | 3/2006 | Sibigtroth |
| 2010/0329065 A1 | 12/2010 | Johnston |
| 2012/0153992 A1* | 6/2012 | Nogawa .................. G06F 1/26 |
| | | 327/76 |
| 2012/0242490 A1 | 9/2012 | Ramaswami |
| 2013/0207695 A1 | 8/2013 | Jeon et al. |
| 2020/0301590 A1* | 9/2020 | Bell .................. G06F 3/0622 |

* cited by examiner

POWER DELIVERY TIMING FOR MEMORY

PRIORITY INFORMATION

This application is a Continuation of U.S. application Ser. No. 16/729,808, filed on Dec. 30, 2019, the contents of which are incorporated herein by reference.

TECHNICAL FIELD

Embodiments of the disclosure relate generally to memory sub-systems, and more specifically, relate to power delivery timing for memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to memory sub-systems that include power delivery timing circuitry. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Memory sub-systems, such as dual in-line memory modules (DIMMs), non-volatile dual in-line memory modules (NVDIMMs), solid state drives (SSDs), etc., often operate under input power of indeterminant and/or variable quality. Various constituent components of such memory sub-systems often have particular power bring-up/bring-down requirements, such as sequence requirements. Variations in the power supply signals can lead to violations of the requirements, which can make the sub-system and/or a number of constituent components inoperable. As an example, a transient low voltage can cause some, but not all, power rails to drop below the operational voltage threshold, which can cause a partial integrated circuit restart that violates bring-up/down requirements. As used herein, a power rail (or rail voltage) can be used to refer to an output voltage of a voltage regulator configured for a particular load.

Conventional memory sub-systems can include one or more sequencers to control the order in which power is supplied to components. However, traditional sequencer circuits can be limited in their ability to withstand fast transient power supply events without violating power bring-up/bring-down requirements. That is, prior sequencer circuits can be adversely affected by power of indeterminate quality.

Aspects of the present disclosure address the above and other deficiencies by preventing transient supply voltage changes from adversely affecting constituent system components that often rely on particular power sequence requirements. Embodiments of the disclosure can provide voltage threshold detection and timing circuitry that can be used to, for example, prevent transient low voltage events from improperly cycling power (e.g., to power sequence dependent devices). Embodiments can also provide improved performance over prior sequencing circuits by allowing a system and/or its constituent components to automatically recover from transient low voltage events without violating power bring-up/down requirements. Various embodiments can reduce operational costs by eliminating the need for manual intervention in order to fix locked components (e.g., components locked due to transient changes to a primary input voltage).

Figure 1:
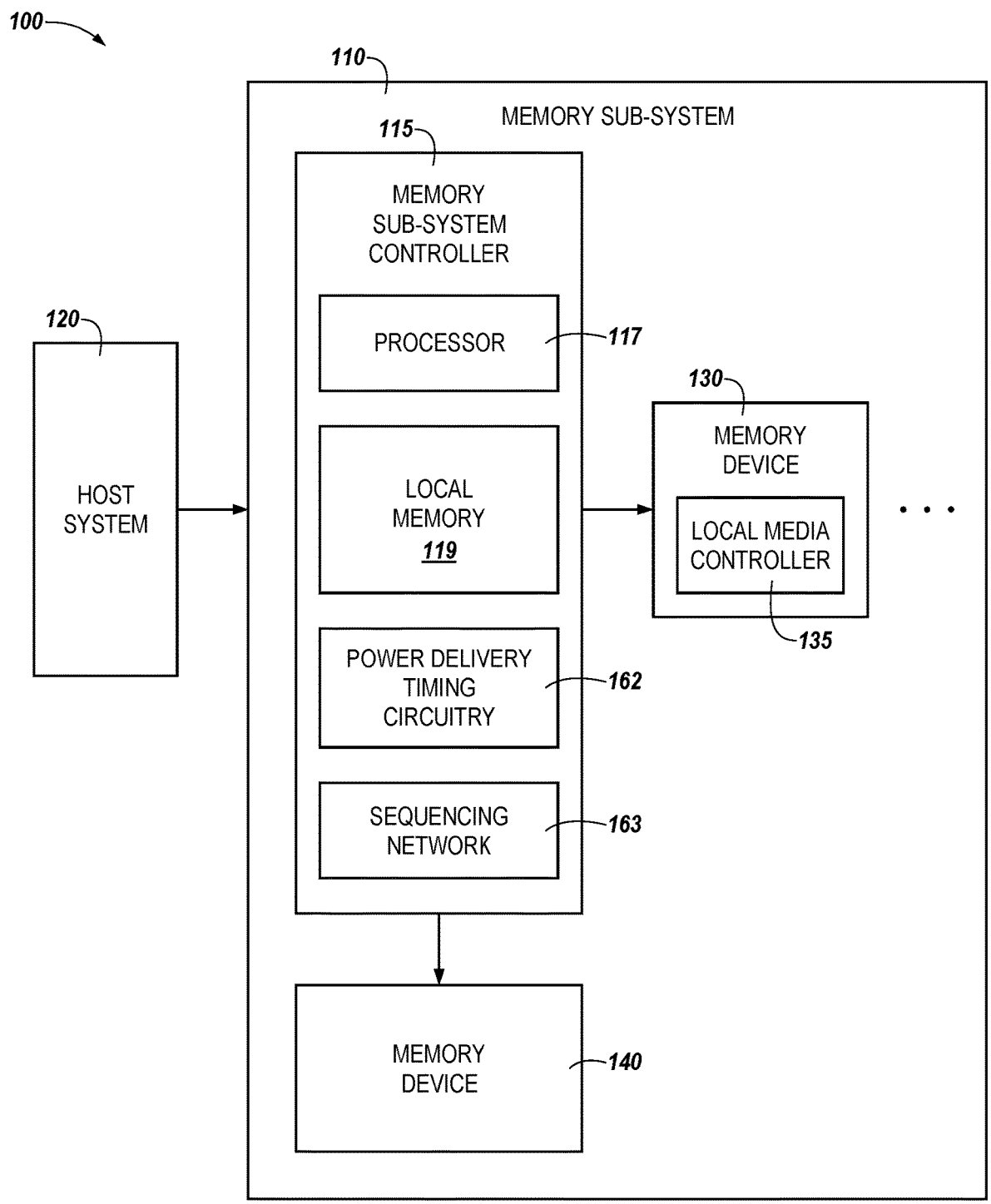
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a desktop computer, laptop computer, network server, mobile device, a vehicle (e.g., automobile, airplane, drone, train, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates an example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports DDR), Open NAND Flash Interface (ONFI), Low Power DDR (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130/140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-AND (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory are described, the memory device 130 can be based on any other type of non-volatile memory, such as read-only memory (ROM), phase change memory (PCM), self-selecting memory, other chalcogenide based memories, ferroelectric transistor random-access memory (FETRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-OR (NOR) flash memory, and electrically erasable programmable read-only memory (EEPROM).

A memory sub-system controller 115 (or controller 115 for simplicity) can communicate with the memory devices 130 and/or 140 to perform operations such as reading data, writing data, or erasing data at the memory devices 130 and/or 140 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include processing device such as a processor 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code, for example. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 and/or 140 as well as convert responses associated with the memory devices 130/140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130/140 include a local media controller 135 that operates in conjunction with memory sub-system controller 115 to execute operations on one or more memory cells of the memory devices 130/140. An external controller (e.g., memory sub-system controller 115) can externally manage the memory devices 130/140 (e.g., perform media management operations on the memory devices). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system controller 115 can also include power delivery timing circuitry 162 coupled to sequencing circuitry 163 (e.g., a sequencing network 263 such as that described further below in association with FIG. 2). As described below in FIG. 2, the power delivery timing circuitry 162 (e.g., 262 in FIG. 0.2) can include voltage threshold detection circuitry (e.g., 260) and timer circuitry (e.g., 261) and can be used to control the sequencing circuitry 163 to ensure power bring-up/down requirements of various different components (e.g., memory devices 130/140, input/output (I/O) circuitry, memory array cores circuitry, peripheral components, etc.) are met even in the presence of transient input power supply events. The voltage threshold detection circuitry can be responsible for asserting and deasserting a timer enable signal (e.g., 243) provided to the timer circuitry. For example, upon an initial power up of the system 110, the voltage threshold detection circuitry can assert the timer enable signal provided to the timer circuitry to trigger the timer circuitry to assert a primary enable signal provided to the sequencing circuitry 163. Asserting the primary enable signal provided to the sequencing network 163 can initiate a startup sequencing of multiple voltage regulators of a power delivery network (PDN) via associated regulator enable signals.

The voltage threshold detection circuitry can monitor a voltage (e.g., primary supply voltage) provided to the system 100. The voltage threshold detection circuitry can deassert the timer enable signal. Responsive to deasserting the timer enable signal, the timer circuitry can deassert the primary enable signal provided to the sequencing circuitry. The timer circuitry can be configured to maintain the primary enable signal in a deasserted state for a particular amount of time (e.g., a recovery time period) subsequent to a detection (by the voltage threshold detection circuitry) of a power supply voltage event and prior to reasserting the primary enable signal. As described further below, the timing circuitry can be configured to reset the recovery time period if a subsequent power supply voltage event is detected prior to expiration of the prior recovery time period.

The recovery time period can be selected so as to be sufficient to allow the sequencing circuitry time to safely power down and ensure residual voltage has drained from power rails in accordance with particular memory device specifications. Accordingly, embodiments of the present disclosure can ensure compliance with power-up/down sequence requirements of a power sequence dependent memory device in the presence of power supply voltage events, such as transient low power events (e.g., the power supply voltage dropping below a threshold level.

Figure 2:
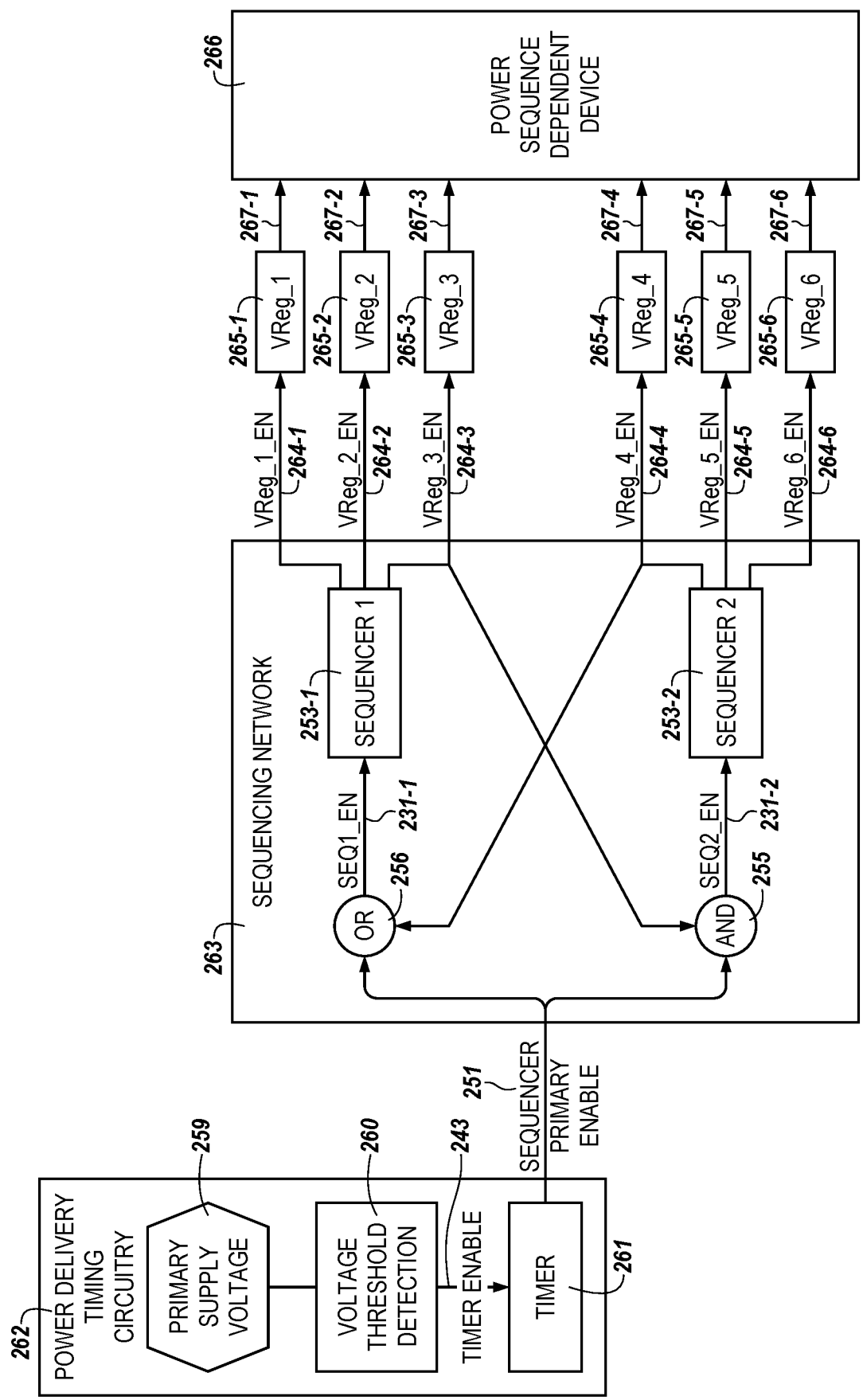
FIG. 2 illustrates an example of power deliver timing circuitry for a sequencing network in accordance with some embodiments of the present disclosure.

FIG. 2 illustrates an example of power deliver timing circuitry 262 coupled to sequencing circuitry 263 (e.g., a sequencing network) in accordance with some embodiments of the present disclosure. FIG. 2 also includes a number of voltage regulators 265-1 to 265-6 configured to provide power supply rails to a power sequence dependent device 266 (e.g., a memory device such as 130/140 described in FIG. 1).

As illustrated in FIG. 2, the power delivery timing circuitry 262 can include voltage threshold detection circuitry 260 and timer circuitry 261. The voltage threshold detection circuitry 260 can be configured to monitor a primary supply voltage 259 provided thereto. The primary supply voltage 259 can serve as a primary power supply to a memory sub-system (e.g., 110) and can be regulated (e.g., via regulators 265-1 to 265-6) to provide multiple power rails to device 266. As an example, the primary supply voltage can be 12 Volts (V); however, embodiments are not limited to a particular supply voltage. In operation, the voltage threshold detection circuitry 260 can detect the occurrence of a primary power supply event and assert a timer enable signal 243 responsive thereto. A primary power supply event can refer to the primary supply voltage reaching a threshold level. For instance, the primary supply voltage transiently dropping below a threshold level (e.g., 10V, 9V, etc.) can be considered a primary power supply event. In various instances, a fluctuation in the primary supply voltage 259 can adversely affect operation of the power sequence dependent memory device 266. For example, a transiently low primary power supply voltage can cause one or more power rails (provided via the voltage regulators 265) to drop below an operation threshold voltage of one or more constituent components of the memory device 266 and/or can cause a power rail to fail to meet a minimum hold-down voltage and/or time duration. Since, the device 266 can have particular power sequence dependent power bring-up/down requirements, a transient supply voltage drop can lead to failure (e.g., lock-up) of one or more device components and/or violate power bring-up/down requirements of the device 266.

As shown in FIG. 2, the timing circuitry 261 can provide a primary enable signal 251 to the sequencing circuitry 263. The sequencing circuitry 263 is configured to provide enable signals (e.g., 264-1, 264-2, 264-3, 264-4, 264-5, 264-6) to respective voltage regulators (e.g., 265-1, 265-2, 265-3, 265-4, 265-5, 265-6) in a particular sequence in order to provide multiple power rails to the device 266 in accordance with particular device power-up/down specifications. Providing power rails in an incorrect order and/or for incorrect durations can cause component lockup issues and/or damage to circuitry. The regulators (referred to collectively as regulators 265) can include buck regulators, boost regulators, and/or low-dropout (LDO) regulators, among other regulator types. The regulator output voltages can correspond to various voltage rails (e.g., 267-1 to 267-6) for the memory device and/or other components of a memory sub-system. Some common voltage rails can include 1V, 2.5V, 3.3V, and 5V; however, embodiments of the present disclosure are not limited to particular rail voltage values. As described further herein, the voltage threshold detection circuitry 260 and timing circuitry 261 can operate to avoid or reduce the likelihood of violating power sequencing specifications of a device 266 and/or of component lock-up due to power supply events such as transient low supply voltage events, for example.

In the example shown in FIG. 2, the sequencing circuitry 263 comprises two 3-channel sequencers 253-1 and 253-2. As described further below, the sequencers 253-1 and 253-2 can be separated integrated circuits and can be coupled together in a chained configuration (e.g., via logic circuitry 255 and 256) such that the sequencing network can provide six output channels to the device 266. The sequencer 253-1 is enabled via enable signal 231-1 and the sequencer 253-2 is enabled via enable signal 231-2. In this example, the output of logic gate 256 (OR) serves as enable signal 231-1 and the output of logic gate 255 (AND) serves as enable signal 231-2. The primary enable signal 251 is provided as inputs to both gates 255 and 256. In this example, the output 264-4 of sequencer 253-2 is provided as an input the OR gate 256 and the output 264-3 of sequencer 253-1 is provided as an input to the AND gate 255. Accordingly, sequencer enable signal 231-1 is asserted responsive to the primary enable signal 251 OR the sequencer output 264-4 being asserted (e.g., logic "1"), and sequencer enable signal 231-2 is asserted responsive to the primary enable signal 251 AND the sequencer output 264-3 being asserted.

As an example, the primary enable signal 251 can be asserted responsive to a power up event (e.g., of a memory sub-system such as a NVDIMM). Due to the chained configuration of the sequencing network 263, the sequencer enable signal 231-1 will be asserted responsive to the assertion of the primary enable signal 251, but the sequencer enable signal 231-2 will remain in the deasserted state until the sequencer output 264-3 is asserted. Once sequencer enable signal 231-2 is asserted (e.g., responsive to assertion of signal 251 AND 264-3), the sequencer outputs 264-4, 264-5, and 264-6 are asserted to enable the corresponding respective voltage regulators 265-4, 265-5, and 265-6 in accordance with a particular power sequence. During a power-down sequence and/or due to a transient low power event, the primary enable signal is deasserted (e.g., logic "0"). The chained configuration of the sequencing network 263 can also provide for suitable (e.g., safe) power-down sequencing of the power rails 267-1, 267-2, 267-3, 267-4, 267-5, and 267-6. For example, responsive to deassertion of the primary enable signal 251, the sequencer enable signal 231-1 can be asserted in order to assert the regulator enable signals 264-1, 264-2 and 264-3 despite deassertion of the signal 251. For instance, even if signal 251 is deasserted, the sequencer enable signal 231-1 is still asserted responsive to assertion of signal 264-4 provided to OR gate 256.

Therefore, as described further herein, the sequencing network 263 and power delivery and timing circuitry 262 are configured to safely power-up and/or power-down device 266 in accordance with power sequence specifications corresponding to the device 266. In a number of embodiments, a power-down sequence can be a reverse order of the power-up sequence.

The power sequence specifications of the device 266 can include an order in which the power rails 267-1 to 267-6 are activated (e.g., responsive to assertion of the enable signals 264-1 to 264-6) and/or a duration for which the power rails are to be provided prior to enabling a next (or previous) regulator. As an example, consider an initial power-up event of a memory sub-system including the components shown in FIG. 2. Upon detecting that the primary power supply voltage 259 has reached a particular level (e.g., 12V), the timer enable signal 243 provided to the timing circuitry 261 can be asserted and the timing circuitry can assert the primary enable signal 251 responsive thereto in order to initiate the power-up sequence (e.g., via the sequencing circuitry 263 and regulators 265-1 to 265-6). That is, responsive to the assertion of the primary enable signal 251, the sequencer enable signal 231-1 will be asserted, which will result in assertion of the regulator enable signals 264-1, 264-2, and 264-3 and subsequent assertion of the regulator enable signals 264-4, 264-5, and 264-6 (e.g., upon assertion of sequencer enable signal 231-2 due to assertion of regulator enable signal 264-3 while the primary enable signal 251 is asserted).

The voltage threshold detection circuitry 260 is configured to monitor the primary supply voltage 259 and detect primary supply voltage events, which can be for example a transient power event in which the primary supply voltage drops below or rises above a threshold level. In a number of embodiments, the voltage threshold detection circuitry is configured to detect when the primary supply voltage drops below a particular threshold level (e.g., 10V, 9V, etc.). The particular threshold level can correspond, for example, to a primary supply voltage level that is likely to cause power supply sequencing issues for a device 266. Such issues can include improper power cycling events and/or violations of device power sequence specifications, which can lead to lock-up and/or damage to components of the device 266. In a number of embodiments, responsive to detection by the detection circuitry 260 of a primary supply voltage event, the timer enable signal 243 can be deasserted, which can trigger the timing circuitry 261 to deassert the primary enable signal 251 provided to the sequencing circuitry 263.

The timing circuitry 261 is also configured to, responsive to the deassertion of the timer enable signal 243, maintain the primary enable signal 251 in a deasserted state for a particular amount of time prior to reasserting the primary enable signal 251. For example, the timing circuitry 261 is configured to maintain the primary enable signal 251 in the deasserted state for a minimum time period responsive to a detected primary supply voltage event. In a number of embodiments, the particular amount of time for which the timing circuitry 261 is configured to maintain the primary enable signal 251 in the deasserted state (responsive to a primary supply voltage event), is determined based on the amount of time needed for the sequencing circuitry 263 to shut down and drain residual voltage from the power rails. Such time period may be based on a device specification, for example. The particular amount of time can be referred to as a "recovery time period."

If a subsequent primary supply voltage event occurs (e.g., is detected by circuitry 260) during the recovery time period, the circuitry 261 can be configured to reset the recovery time period such that the primary enable signal 251 remains deasserted (responsive to the detection of the subsequent primary supply voltage event) for an additional amount of time corresponding to the recovery time period. It is noted that, in instances in which the primary supply voltage is a non-monotonic voltage ramp, each excursion below the voltage threshold (e.g., the "on" level) can present to the timing circuitry 261 as a primary supply voltage event.

In the absence of the timing circuitry 261, a transient low power event can result in problems such as improperly cycling power to the power sequence dependent device 266 and/or components thereof. Embodiments of the present disclosure can prevent transient power supply events from improperly cycling power, which can prevent lock-up of power sequence dependent devices and reduce or eliminate the need for manual intervention, which can reduce operations costs, among other benefits.

Figure 3:
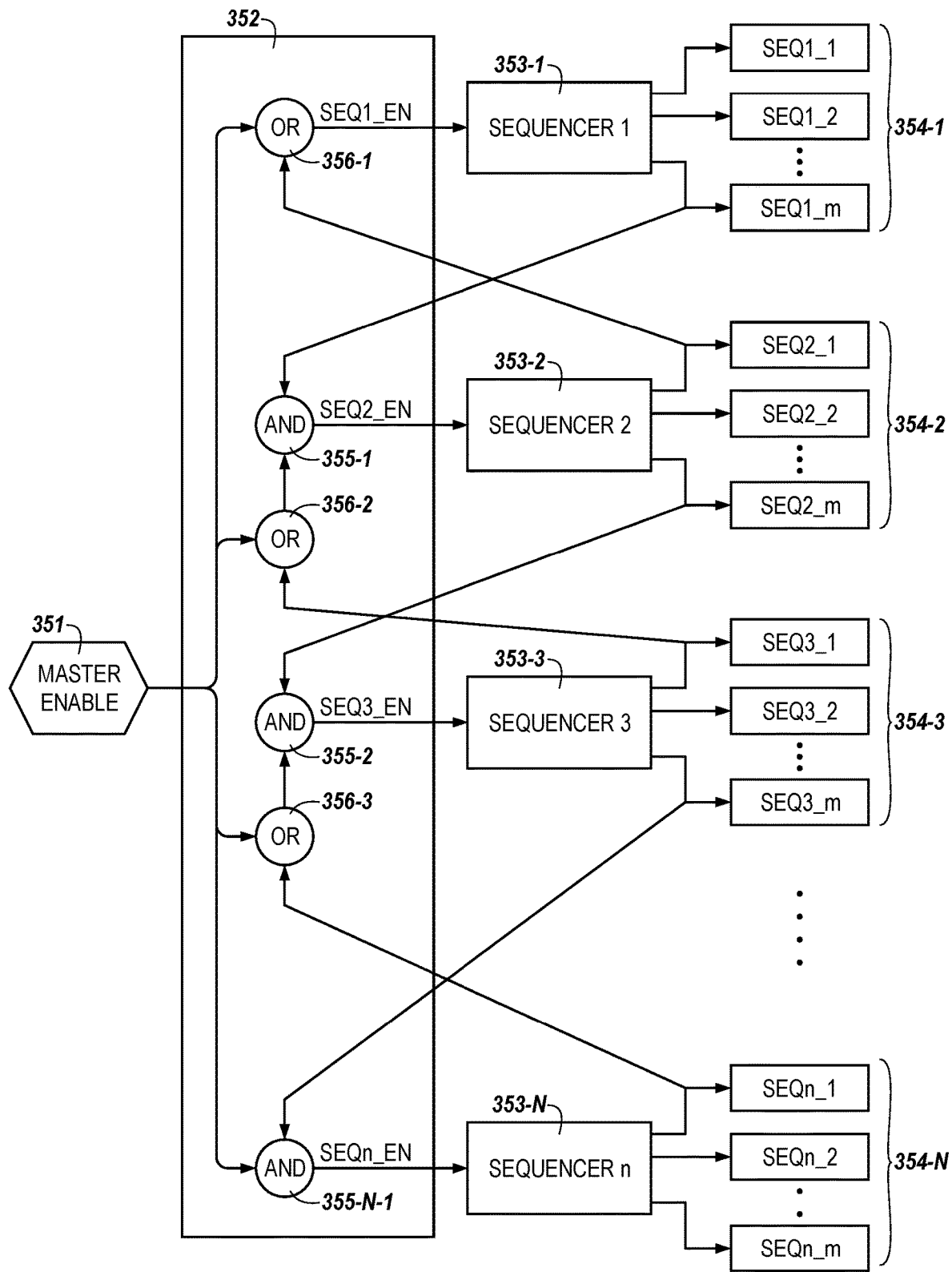
FIG. 3 illustrates an example of sequencing circuitry in accordance with some embodiments of the present disclosure.

FIG. 3 illustrates an example of sequencing circuitry in accordance with some embodiments of the present disclosure. The sequencing circuitry illustrated in FIG. 3 can be used in a memory sub-system such as that described in FIG. 2. In this example, the sequencing circuitry comprise a number of sequencers 353-1, 353-2, 353-3, . . . , 353-N (referred to collectively as sequencers 353) coupled to logic circuitry 352 used to control asserting and deasserting (e.g., enabling and disabling) of the sequencers 353 (e.g., via respective sequencer enable signals SEQ1_EN, SEQ2_EN, SEQ3_EN, . . . , SEQn_EN). The sequencers 353 are coupled in a chained configuration via the logic 352 such that the sequencer outputs are asserted in a particular order (e.g., forward and reverse). The respective outputs of the sequencers 353 can be enable signals provided to components 354-1, 354-2, 354-3, . . . , 354-N (referred to collectively as components 354). As an example, the components 354 can be voltage regulators.

The logic circuitry 352 includes a number of AND gates 355-1, 355-2, . . . , 355-N–1 (referred to collectively as gates 355) and a number of OR gates 356-1, 356-2, 356-3 (referred to collectively as gates 356). As shown in FIG. 3, each of the sequencers 353, other than a first sequencer 353-1 in the chain and a last sequencer 353-N, have an AND gate 355 and an OR gate 356 corresponding thereto. The master enable signal 351, which can be analogous to primary enable signal 251, is provided to all of the OR gates 356 as well as to the AND gate 355-N–1 corresponding to the last sequencer in the chain 353-N.

As shown in FIG. 3 and as described above in association with FIG. 2, the outputs of the sequencers are provided to particular logic gates 355/356 corresponding to next and/or prior sequencers 353 in the chained configuration to facilitate enabling the sequencer outputs in a particular order (e.g., due to assertion of the master enable signal 351) or reverse order (e.g., due to deassertion of signal 351). For example, the output signal provided to component "SEQ1_m" from sequencer 353-1 is also provided to an input of the AND gate 355-1 corresponding to sequencer 353-2, the output signal provided to component "SEQ2_m" from sequencer 353-2 is also provided to an input of the AND gate 355-2 corresponding to sequencer 353-3, and the output signal provided to component "SEQ3_m" from sequencer 353-3 is also provided to an input of the AND gate 355-N–1 corresponding to sequencer 353-N. Similarly, the output signal provided to component "SEQn_1" from sequencer 353-N is also provided to an input of the OR gate 356-3 corresponding to sequencer 353-3, the output signal provided to component "SEQ3_1" from sequencer 353-3 is also provided to an input of the OR gate 356-2 corresponding to sequencer 353-2, and the output signal provided to component "SEQ2_1" from sequencer 353-2 is also provided to an input of the OR gate 356-1 corresponding to sequencer 353-1.

In operation, the configuration of the logic circuitry 352 and sequencing circuitry provides for sequencing output signals in order from the first sequencer 353-1 to the last sequencer 353-N responsive to assertion of the master enable signal 351. Additionally, the configuration of the logic circuitry 352 and sequencing circuitry provides for sequencing output signals in reverse order from the last sequencer 353-N to the first sequencer 353-1 responsive to deassertion of the master enable signal 351. In embodiments in which the components 354 are voltage regulators such as described in association with FIG. 2, the circuitry can be used to provide sequenced power rails to a power sequence dependent device (e.g., 266). That is, the sequenced power signals can be provided in a first order during power-up of the device and in a reverse order during power-down (e.g., due to a transient low power event or otherwise) in order to comply with power sequence specifications of the device.

Figure 4:
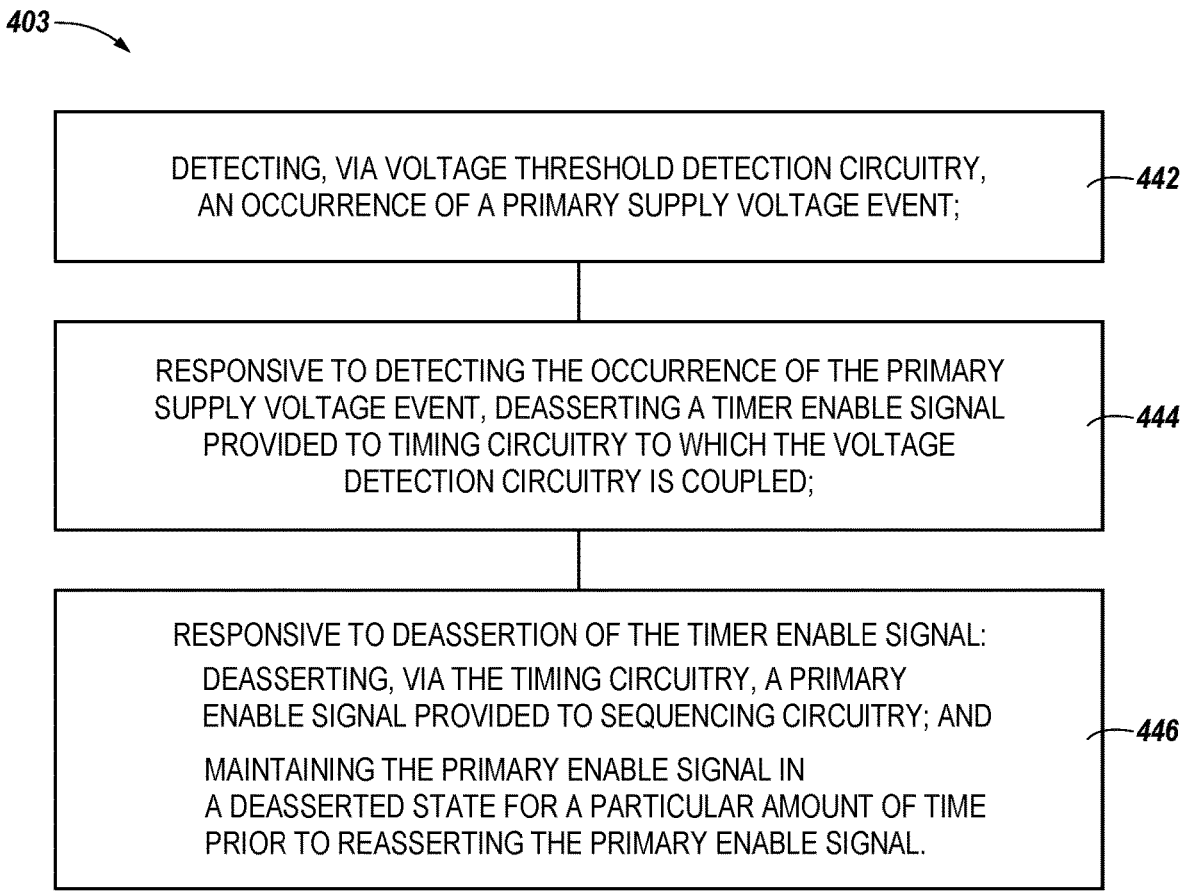
FIG. 4 is a flow diagram of an example method for power delivery timing in accordance with some embodiments of the present disclosure.

FIG. 4 is a flow diagram of an example method 403 for power delivery timing in accordance with some embodiments of the present disclosure. The method 403 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 403 is performed by the power delivery timing circuitry 262 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, the power delivery timing circuitry can detect an occurrence of a primary supply voltage event, which can include a transient low power event in which the primary supply voltage drops below a threshold level, for example.

At operation 444, the power delivery timing circuitry, responsive to detecting the occurrence of the primary supply voltage event, deasserts a timer enable signal provided to timing circuitry to which the voltage detection circuitry is coupled.

At operation 446, the power delivery timing circuitry, responsive to deassertion of the timer enable signal, deasserts, via the timing circuitry, a primary enable signal provided to sequencing circuitry, and maintains the primary enable signal in a deasserted state for a particular amount of time prior to reasserting the primary enable signal. The sequencing circuitry can assert sequenced enable signals to a number of voltage regulators responsive to assertion of the primary enable signal and can deassert the sequenced enable signals responsive to deassertion of the primary enable signal. In a number of embodiments, the method can include reasserting the primary enable signal responsive to reassertion of the timer enable signal and the particular amount of time having lapsed.

In a number of embodiments, the primary supply voltage event is a first (e.g., initial) primary supply voltage event and includes a primary supply voltage provided to the voltage threshold detection circuitry having dropped below a threshold level. In such instances, the method can include responsive to the voltage threshold detection circuitry detecting a second primary supply voltage event prior to expiration of the particular amount of time: reasserting the timer enable signal provided to the timing circuitry; and resetting the timing circuitry such that the primary enable signal is maintained in a deasserted state for an additional particular amount of time despite the timer enable signal being reasserted. In various embodiments, the particular amount of time for which the primary enable signal is deasserted is sufficient for residual voltage to drain from power rails supplied to a memory device in accordance with memory device specifications. Maintaining the primary enable signal in the deasserted state for the particular amount of time prior to reasserting the primary enable signal can prevent violation of one or more of power bring-up or power bring-down requirements of power sequence dependent components of the memory device.

Figure 5:
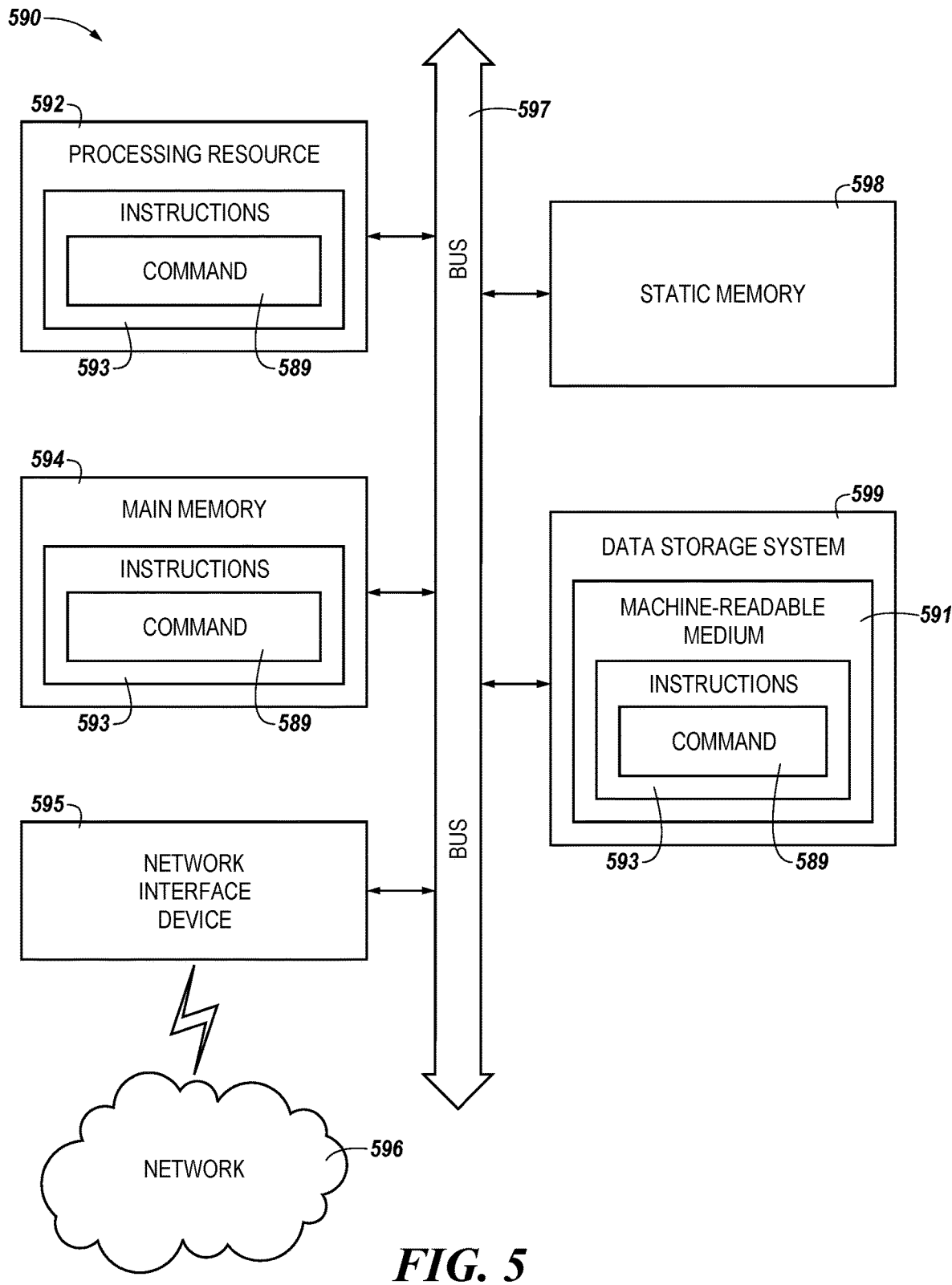
FIG. 5 is a block diagram of an example computer system in which embodiments of the present disclosure may operate.

FIG. 5 illustrates an example machine of a computer system 590 within which a set of instructions, for causing the machine to perform one or more of the methodologies discussed herein, can be executed. In some embodiments, the computer system 590 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power delivery timing circuitry 162 and/or sequencing network 163 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 590 includes a processing resource 592 (e.g., a processing device), a main memory 594 (e.g., read-only memory (ROM), flash memory, dynamic random access memory (DRAM) such as synchronous DRAM (SDRAM) or Rambus DRAM (RDRAM), etc.), a static memory 598 (e.g., flash memory, static random access memory (SRAM), etc.), and a data storage system 599, which communicate with each other via a bus 597.

The processing device 592 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 592 can also be one or more special-purpose processing devices such as an application specific integrated circuit (ASIC), a field programmable gate array (FPGA), a digital signal processor (DSP), network processor, or the like. The processing device 592 is configured to execute instructions 593 for performing the operations and steps discussed herein. The computer system 590 can further include a network interface device 595 to communicate over the network 596.

The data storage system 599 can include a machine-readable storage medium 591 (also known as a computer-readable medium) on which is stored one or more sets of instructions 593 or software embodying any one or more of the methodologies or functions described herein. The instructions 593 can also reside, completely or at least partially, within the main memory 594 and/or within the processing device 592 during execution thereof by the computer system 590, the main memory 594 and the processing device 592 also constituting machine-readable storage media. The machine-readable storage medium 591, data storage system 599, and/or main memory 594 can correspond to the memory sub-system 110 of FIG. 1.

In one embodiment, the instructions 593 include instructions to implement functionality corresponding to the power delivery timing circuitry 162 of FIG. 1. The instructions can include a command 589 associated with operating the power delivery timing circuitry 162 and/or sequencer circuitry 163 in FIG. 1. While the machine-readable storage medium 591 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory device;
   sequencing circuitry configured to provide enable signals to a number of voltage regulators in association with providing sequenced power signals via a plurality of power rails to the memory device;
   voltage threshold detection circuitry configured to, responsive to detecting a primary supply voltage event, deassert a timer enable signal provided to timing circuitry;
   wherein the timing circuitry is configured to, responsive to the deassertion of the timer enable signal, maintain a primary enable signal in a deasserted state for a particular amount of time prior to reasserting the primary enable signal; and
   wherein the sequencing circuitry comprises logic circuitry coupled to the number of voltage regulators and is further configured to drain residual voltage from the plurality of power rails in a particular order using the logic circuitry.

2. The system of claim 1, wherein the voltage threshold detection circuitry is further configured to, responsive to detecting a different primary supply voltage event, assert the timer enable signal provided to the timing circuitry;
   wherein the timing circuitry is configured to reassert the primary enable signal; and
   wherein the sequencing circuitry is further configured to provide a voltage to the plurality of power rails in a different particular order using the logic circuitry.

3. The system of claim 2, wherein the different particular order is a reverse order of the particular order.

4. The system of claim 3, wherein the logic circuitry is configured to utilize a same plurality of gates to implement the particular order and the reverse order.

5. The system of claim 2, wherein the voltage threshold detection circuitry is configured to detect the different primary power supply event comprising a primary power supply voltage being greater than a particular threshold.

6. The system of claim 1, wherein the voltage threshold detection circuitry is configured to detect the primary power supply event comprising a primary power supply voltage being lower than a different particular threshold.

7. The system of claim 1, wherein the memory device experiences power supply sequencing issues responsive to a primary power supply being lower than a different particular threshold.

8. The system of claim 1, wherein the logic circuitry comprises a plurality of gates that chain the output of a portion of sequencers to the input of a different portion of the sequencers to provide the particular order.

9. A method, comprising:
   responsive to detecting an occurrence of a primary supply voltage event, deasserting a timer enable signal provided to timing circuitry to which a voltage detection circuitry is coupled; and
   responsive to deassertion of the timer enable signal:
     deasserting, via the timing circuitry, a primary enable signal provided to sequencing circuitry;
   responsive to deasserting the primary enable signal:
     deasserting, via logic circuitry of the sequencing circuitry, enable signals to a plurality of sequencers of the sequencing circuitry,
     wherein the logic circuitry, using a plurality of logic gates, determines an order in which the enable signals are deasserted to the plurality of sequencers of a sensing circuitry.

10. The method of claim 9, wherein the sequencing circuitry comprises a chained sequencer network comprising the plurality of sequencers that are chained utilizing the logic circuitry.

11. The method of claim 9, wherein the primary enable signal is deasserted, via the timing circuitry, for a particular duration of time sufficient to drain residual voltage from power rails coupled to a plurality of voltage regulators coupled to the sequencing circuitry.

12. The method of claim 11, further comprising, responsive to, detecting a different occurrence of a different primary supply voltage event, deassaserting the primary enable signal for an additional duration of time.

13. The method of claim 9, further comprising, responsive to deasserting the enable signals to the plurality of sequencers, deasserting enable signals to a plurality of voltage regulators utilizing a plurality of channels for each of the plurality of sequencers.

14. A system, comprising:
   a memory device comprising a plurality of power sequence dependent components;
   power sequencing circuitry comprising logic circuitry including:
     an OR gate and an AND gate; and
     a plurality of sequencers, coupled to the OR gate and the AND gate, and configured to provide enable signals to a number of voltage regulators coupled to the plurality of power sequence dependent components responsive to an assertion of a primary enable signal provided thereto;
   timing circuitry configured to:
     responsive to a first assertion of a timer enable signal provided thereto, assert the primary enable signal; and
     responsive to a subsequent deassertion of the timer enable signal, deassert the primary enable signal and maintain the primary enable signal in a deasserted state for a recovery time period.

15. The system of claim 14, wherein the power sequencing circuitry is configured to:
provide a first output of the OR gate to a first sequencer from the plurality of sequencers; and
provide a second output of the AND gate to a second sequencer from the plurality of sequencers.

16. The system of claim 15, wherein the power sequencing circuitry is configured to provide the primary enable signal to the OR gate and the AND gate at a same time.

17. The system of claim 15, wherein the power sequencing circuitry is configured to provide an enable signal, from the enable signals, from a channel of the first sequencer to the AND gate as an input.

18. The system of claim 17, wherein the channel, from a plurality of channels of the first sequencer, provides the enable signal lastly as compared to the plurality of channels.

19. The system of claim 15, wherein the power sequencing circuitry is configured to provide an enable signal, from the enable signals, from a channel of the second sequencer to the OR gate of an input.

20. The system of claim 19, wherein the channel, from a plurality of channels of the second sequencer, provides the enable signal firstly as compared to the plurality of channels.

* * * * *